United States Patent [19]

Tsuruta

[11] Patent Number: 5,448,056
[45] Date of Patent: Sep. 5, 1995

[54] PHOTOELECTRIC CONVERTING CIRCUIT HAVING AN AMPLIFICATION FACTOR

[75] Inventor: Yoshio Tsuruta, Kawasaki, Japan

[73] Assignee: Fuji Electric Co., Ltd., Kawasaki, Japan

[21] Appl. No.: 192,692

[22] Filed: Feb. 7, 1994

[30] Foreign Application Priority Data

Feb. 10, 1993 [JP] Japan ................................. 5-021564

[51] Int. Cl.6 ............................................. G01J 1/46
[52] U.S. Cl. ........................... 250/214 A; 356/215; 327/342; 327/514; 250/208.1
[58] Field of Search ............ 250/214 A, 214 R, 208.1; 307/311, 491, 494; 356/215, 218; 328/128, 162, 165; 327/514, 342, 345, 337, 363

[56] References Cited

U.S. PATENT DOCUMENTS

| | | | |
|---|---|---|---|
| 4,390,258 | 6/1983 | Mizokami | 356/215 |
| 4,666,301 | 5/1987 | Gruenke | 356/218 |
| 5,198,660 | 3/1993 | Yokoyama et al. | 250/214 A |
| 5,233,180 | 8/1993 | Tsuruta et al. | 250/214 A |
| 5,307,145 | 4/1994 | Schenkel et al. | 250/214 A |
| 5,322,994 | 6/1994 | Uno | 250/214 A |

*Primary Examiner*—Edward P. Westin
*Assistant Examiner*—John R. Lee
*Attorney, Agent, or Firm*—Spencer, Frank & Schneider

[57] ABSTRACT

A photoelectric converting circuit having a photodiode generating a photoelectric current in accordance with the quantity of light, a first integrating circuit integrating the photoelectric current to convert it into a voltage, and a charge amplifier amplifying the change in the output voltage of the first integrating circuit. The charge amplifier is composed of a second integrating circuit and a coupling capacitance connected between the output of the first integrating circuit and the input of the second integrating circuit. The change in the output of the second integrating circuit is proportional to the ratio of the coupling capacitance to the integration capacitance of the second integrating circuit. This makes it possible to improve the sensitivity of the photoelectric converting circuit without reducing the value of the integration capacitance of the first integrating circuit.

7 Claims, 3 Drawing Sheets

PHOTOELECTRIC CONVERTING CIRCUIT HAVING AN AMPLIFICATION FACTOR

BACKGROUND OF THE INVENTION

1. Field of the Invention

The present invention relates to a photoelectric converting circuit including a photoelectric converter element and an integrating circuit using an operational amplifier.

2. Description of Related Art

Conventional photoelectric converting circuits employing a photoelectric converter element such as a photodiode are shown in FIGS. 1A–1C.

In FIG. 1A, a conventional photoelectric converting circuit comprises a photodiode 1, a read switch 2, a reset switch 3, and a load capacitance 4. In FIG. 1B, another conventional photoelectric converting circuit comprises a source follower FET 5 that amplifies the output of the photodiode 1. The source follower FET 5 contains a parasitic capacitance $C_1$.

The photoelectric converting circuit of FIG. 1A stores the photoelectric current generated by the photodiode into the load capacitance 4 in a fixed time. The voltage $\Delta V$ output from the load capacitance 4 is expressed as follows:

$$\Delta V = \frac{i \times T}{C_{PD} + C_L} \quad (1)$$

where $C_{PD}$ is the junction capacitance of the photodiode 1, $C_L$ is the capacitance of the load capacitance 4, and i is the photoelectric current generated by the photodiode 1.

Similarly, the output voltage $\Delta V$ of the photoelectric converting circuit of FIG. 1B is given by the following equation.

$$\Delta V = \frac{i \times T}{C_{PD} + C_1} \quad (2)$$

The sensitivity of the photoelectric converting circuits of FIGS. 1A and 1B can be increased by reducing the junction capacitance $C_{PD}$ of the photodiode 1 or the parasitic capacitance C1 of the source follower FET 5. However, since the junction capacitance $C_{PD}$ of the photodiode 1 is directly proportional to the junction area of the photodiode 1, reducing the junction capacitance will also reduce the photoelectric current i. For this reason, it is difficult to reduce the junction capacitance $C_{PD}$.

Likewise, the parasitic capacitance $C_1$ of FIG. 1B cannot be reduced to an extremely small value in order to maintain the accuracy of the source follower FET 5 at a certain level.

To further improve the sensitivity, another photoelectric converting circuit using an operational amplifier as shown in FIG. 1C has been proposed.

In FIG. 1C, the reference numeral 6 designates an operational amplifier, the reference numeral 7 denotes an integration capacitance, and the reference numeral 8 designates a reset switch.

In the photoelectric converting circuit of FIG. 1C, the photoelectric current generated by the photodiode 1 is input to the integrating circuit composed of the operational amplifier 6 and the integration capacitance 7, stored in the integration capacitance 7, and amplified and output as the output voltage $\Delta V$.

During this operation, the inverting input terminal of the operational amplifier 6, to which the anode of the photodiode 1 is connected, is maintained at Vref. Accordingly, the photoelectric current i generated by the photodiode 1 is stored only into the integration capacitance 7 without being stored in the junction capacitance $C_{PD}$ and the parasitic capacitance $C_1$. Therefore, the output $\Delta V$ of the circuit is expressed by the following equation.

$$\Delta V = \frac{-i \times T}{C_2} \quad (3)$$

where $C_2$ is the capacitance of the integration capacitance 7. The capacitance $C_2$ can be changed independently because it is not associated with other characteristics as the capacitance $C_{PD}$ or $C_1$. Thus, the sensitivity of the circuit can be increased by reducing the capacitance $C_2$ because this will increase the output $\Delta V$.

The circuit of FIG. 1C, however, presents the following problem.

Reducing the capacitance $C_2$ to improve the sensitivity causes a problem in that the effect of switching noise induced by turning off the reset switch 8 will increase. The reset switch 8 is usually composed of a MOSFET which includes a coupling capacitance $C_{GD}$ across the gate and drain, and a coupling capacitance $C_{GS}$ across the gate and source as shown in FIG. 2. Since the changes in the gate potential have an influence on the source and drain through these capacitances, the switching noise is applied to the input of the operational amplifier 6 in FIG. 1C when operating the reset switch 8.

The switching noise is amplified by the operational amplifier 6 whose amplification factor is substantially proportional to the reciprocal of the capacitance $C_2$ of the integration capacitance 7. Therefore, the effect of the noise increases as the capacitance $C_2$ reduces.

In addition, reducing the capacitance $C_2$ will increase the effect of fabrication error. Specifically, fabricating a very small capacitance $C_2$ requires a fine pattern to be formed, and the fabrication error increases as the pattern becomes finer.

As a result, a circuit including a plurality of sensors of FIG. 1C presents a problem in that the sensitivity varies from sensor to sensor because of the variation in the capacitance $C_2$.

In summary, reducing the integration capacitance of the conventional photoelectric converting circuit using an operational amplifier to improve the sensitivity presents a problem in that the reduction in the integration capacitance will increase the output noise or the variation in sensitivity, thus limiting the increase in the sensitivity.

SUMMARY OF THE INVENTION

It is therefore an object of the present invention to provide a photoelectric converting circuit which can increase the sensitivity without reducing the integration capacitance, and decrease the output noise or the variation in the sensitivity.

In the first aspect of the present invention, there is provided a photoelectric converting circuit comprising:

a photoelectric converter element generating a photoelectric current in accordance with a quantity of light;

a first integrating circuit integrating the photoelectric current to convert the photoelectric current into a voltage;

a coupling capacitance whose first terminal is connected to the output of the first integrating circuit; and a second integrating circuit whose input is connected to a second terminal of the coupling capacitance, the second integrating circuit amplifying the voltage applied thereto from the first integrating circuit via the coupling capacitance.

Here, each of the first integrating circuit and the second integrating circuit may comprise:

an operational amplifier;

an integration capacitance connected between the inverting input terminal and the output terminal of the operational amplifier; and a switch connected in parallel with the integration capacitance.

Both the switch of the first integrating circuit and the switch of the second integrating circuit may be turned on initially, and the switch of the second integrating circuit may be turned off when a predetermined time period has elapsed after the switch of the first integrating circuit is turned off.

In the second aspect of the present invention, there is provided a photoelectric converting system comprising a plurality of photoelectric converting circuits, each of the photoelectric converting circuits comprising:

a photoelectric converter element generating a photoelectric current in accordance with a quantity of light;

a first integrating circuit integrating the photoelectric current to convert the photoelectric current into a voltage;

a coupling capacitance whose first terminal is connected to the output of the first integrating circuit; and a second integrating circuit whose input is connected to a second terminal of the coupling capacitance, the second integrating circuit amplifying the voltage applied thereto from the first integrating circuit via the coupling capacitance.

According to the present invention, a photoelectric current, which is generated by the photoelectric converter element, is converted into a voltage by the first integrating circuit, and that voltage is applied to the second integrating circuit through the coupling capacitance to be amplified by the second integrating circuit, thereby being produced as the output.

In this case, the amplifying factor for the output voltage of the first integrating circuit depends on the ratio of the coupling capacitance, which is connected between the first and second integrating circuits, to the integration capacitance of the second integrating circuit. As a result, the output voltage of the photoelectric converting circuit can be increased without reducing the integration capacitance of the first integrating circuit. This differs from the conventional photoelectric converting circuit in which the sensitivity is increased by reducing the integration capacitance.

Therefore, the switching noise caused by reducing the integration capacitance can be prevented. In addition, the sensitivity of a photoelectric converting system employing a plurality of such photoelectric converting circuits can be improved, while restricting the variation in sensitivity of the photoelectric converting circuits to a very small value.

Moreover, when the switch of the second integrating circuit is turned off after a predetermined time period has elapsed after the switch of the first integrating circuit is turned off, the effect of the switching noise caused by the first integrating circuit can be eliminated from the output of the second integrating circuit. This is because the switching noise caused by turning off the switch of the first integrating circuit disappears during the predetermined time period.

The above and other objects, effects, features and advantages of the present invention will become more apparent from the following description of the embodiment thereof taken in conjunction with the accompanying drawings.

DETAILED DESCRIPTION OF PREFERRED EMBODIMENT

The invention will now be described with reference to the accompanying drawings.

Figure 1A:
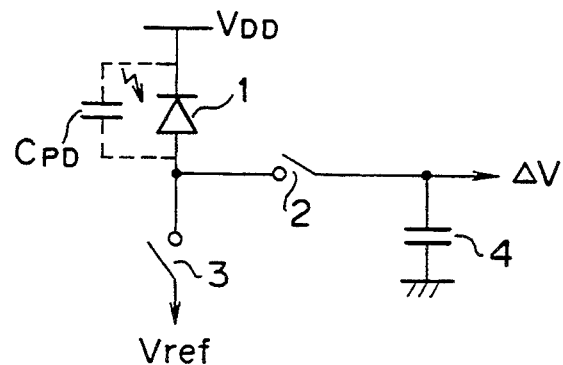
FIGS. 1A–1C are circuit diagrams showing conventional photoelectric converting circuits.
Figure 1B:
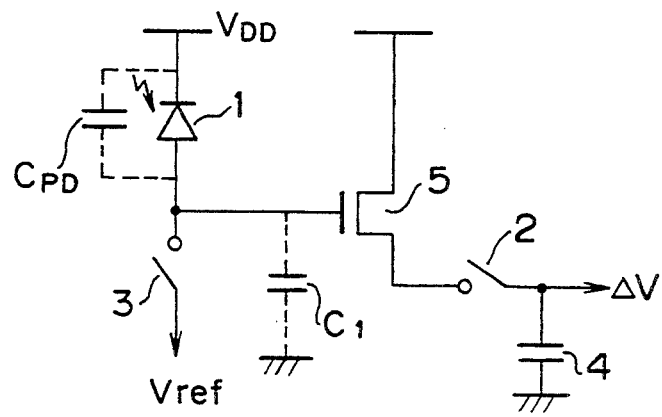
Figure 1C:
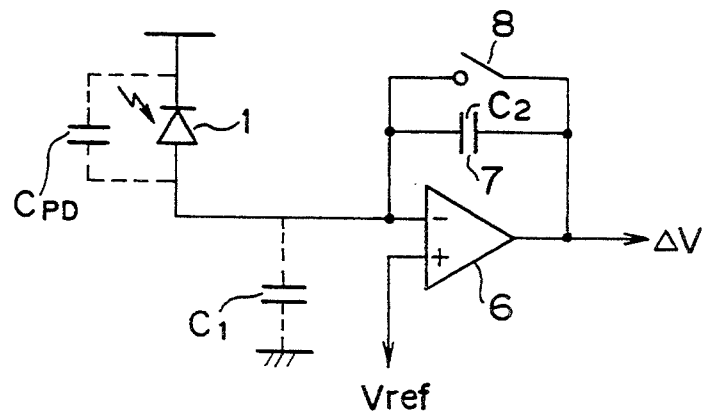
Figure 2:
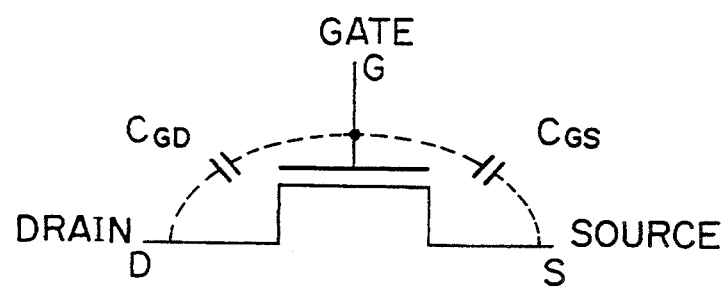
FIG. 2 is a schematic diagram illustrating coupling capacitances of a MOSFET used in the circuit shown in FIG. 1C.
Figure 3:
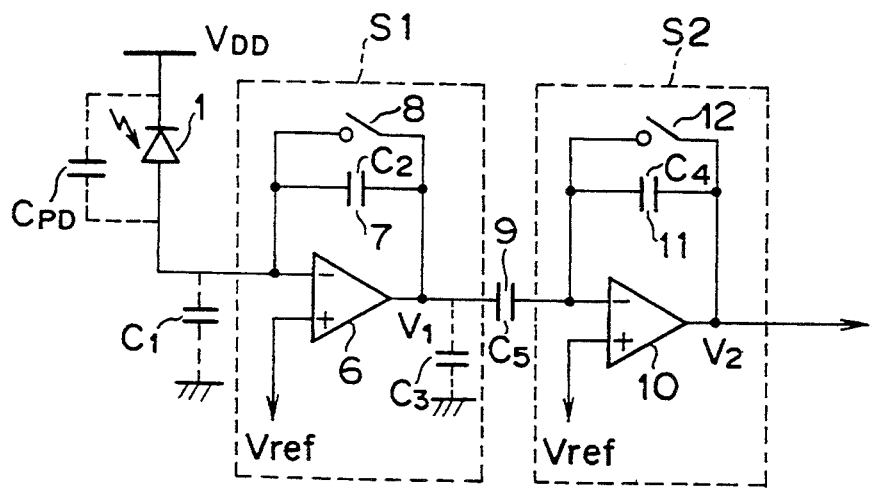
FIG. 3 is a circuit diagram showing an embodiment of a photoelectric converting circuit in accordance with the present invention.

In FIG. 3, the reference numeral 1 designates a photodiode that detects light and generates a photoelectric current, the reference numeral 6 designates a first operational amplifier, the reference numeral 7 designates a first integration capacitance, the reference numeral 8 designates a first reset switch that resets the charge stored in the first integration capacitance 7 when turned on, the reference numeral 9 designates a capacitance provided between the first operational amplifier 6 and a second operational amplifier 10, the reference numeral 11 designates a second integration capacitance, and the reference numeral 12 designates a second reset switch that resets the charge stored in the second integration capacitance 11 when turned on.

Furthermore, $C_1$ denotes a parasitic capacitance associated with the line from the photodiode 1 to the input of the first operational amplifier 6, and $C_3$ denotes a parasitic capacitance associated with the line from the output of the first operational amplifier 6 to the capacitance 9. In addition, $C_{PD}$ designates a junction capacitance of the photodiode 1, $V_1$ is the output voltage of the first operational amplifier 6, and $V_2$ is the output voltage of the second operational amplifier 10.

Moreover, S1 designates a first integrating circuit including the first operational amplifier 6, the first integration capacitance 7 and the first reset switch 8, and S2 designates a second integrating circuit including the second operational amplifier 10, the second integration capacitance 11 and the second reset switch 12.

Next, the operation of the embodiment of the photoelectric converting circuit in accordance with the present invention will be described with reference to FIGS. 4A and 4B which illustrate timings of the operation of the circuit.

Figure 4A:
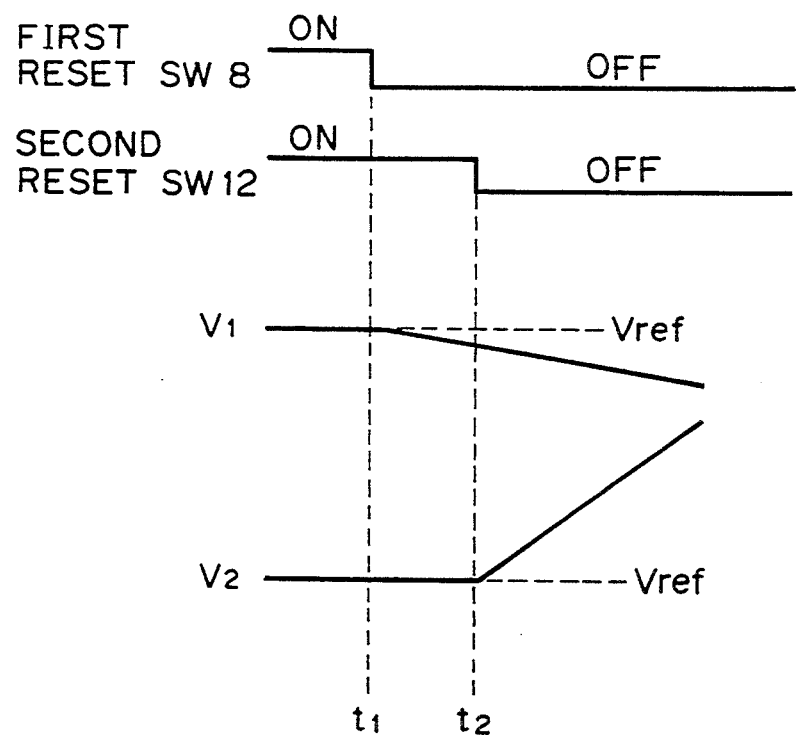
FIGS. 4A and 4B are diagrams illustrating operations of the embodiment shown in FIG. 3.

First, the reset switches 8 and 12 are simultaneously made ON (conductive) as shown in FIG. 4A. This sets all the input and output terminals of the first and second operational amplifiers 6 and 10 at an initial value equal to the reference voltage Vref, and resets the charges of the first and second integration capacitances 7 and 11.

Subsequently, the first reset switch 8 is made OFF (nonconductive) at time $t_1$. By this, the photoelectric current generated by the photodiode 1 begins to be stored in the first integration capacitance 7 of the first integrating circuit S1, so that the output voltage $V_1$ of the first operational amplifier begins to drop. At this point, the voltages of the input terminals of the first operational amplifier 6 and the voltages of the input and output terminals of the second operational amplifier 10 are maintained at Vref because of the imaginary (virtual) short circuit.

At time $t_2$, the second reset switch 12 is turned OFF. By this, the output voltage $V_1$ of the first operational amplifier 6 is amplified by the second integrating circuit S2, so that the output voltage $V_2$ of the second operational amplifier 10 increases with time.

The output voltage $V_1$ of the first operational amplifier 6 at time $t_1+T_1$ is given by the following equation.

$$V_1 = V_{ref} - \frac{-i \times T_1}{C_2} \quad (4)$$

where $C_2$ is the value of the first integration capacitance 7, and i is the photoelectric current generated by the photodiode 1. The output voltage $V_2$, on the other hand, increases with time after time $t_2$, and the deviation $\Delta V_2$ of the output voltage $V_2$ from the reference voltage Vref is given by the following equation because the capacitance 9 and the second integrating circuit S2 constitute a charge amplifier.

$$\Delta V_2 = -\Delta V_1 \times \frac{C_5}{C_4} \quad (5)$$

where $C_4$ is the value of the second integration capacitance 11, $C_5$ is the value of the capacitance 9, and $\Delta V_1$ is a deviation of the output voltage $V_1$ from the reference voltage Vref after time $t_2$.

Equation (5) shows that the sensitivity of the photoelectric converting circuit increases by $C_5/C_4$, because $\Delta V_2$ equals $-\Delta V_1$ multiplied by $C_5/C_4$. In other words, the sensitivity of the circuit can be improved by increasing the value $C_5/C_4$. This differs from the conventional circuit wherein the sensitivity is improved by reducing the capacitance value $C_2$ of the first integration capacitance 7. As a result, little effect of noise induced by the first reset switch 8 appears in the output of the circuit.

In addition, the variation in individual circuits which occurs when a plurality of photoelectric converting circuits are used can be reduced. This is because a very fine patterns is not required to form the first integration capacitance 7 in order to reduce the capacitance value $C_2$, and hence, the effect of the fabrication error can be reduced.

Although there may be a concern that the effect of the switching noise of the second reset switch 12 might appear in the output $V_2$, the effect of the switching noise can be avoided by selecting the capacitance value $C_4$ of the second integration capacitance 11 to be a rather large value, such as 1 pF.

To satisfy this condition and to achieve an amplification factor of about ten for the second integrating circuit S2, the capacitance value $C_5$ of the capacitance 9 should be set at 10 pF because the capacitance value $C_4$ of the integration capacitance 11 is approximately 1 pF.

Although the effect of the switching noise caused by the first reset switch 8 can be reduced by increasing the capacitance value $C_2$ of the first integration capacitance 7, it can also be eliminated by another method. That is, the effect of the noise can be canceled by turning OFF the second reset switch 12 after turning OFF the first reset switch 8, even if the noise appears at the output of the first operational amplifier 6.

Figure 4B:
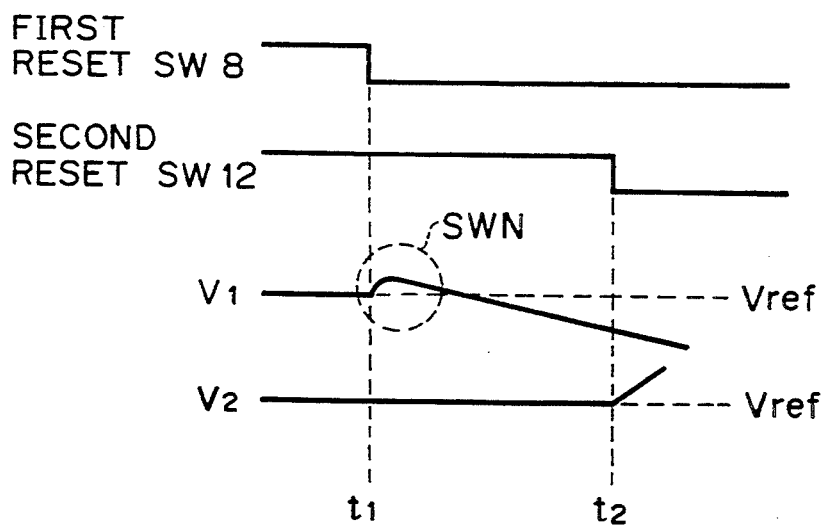

FIG. 4B illustrates this operation. As shown in this figure, the effect of the noise SWN appears in the output voltage $V_1$ of the first operational amplifier 6 immediately after the first reset switch 8 is turned OFF. At this point, however, the input terminals of the second operational amplifier 12 are maintained at Vref because the second reset switch 12 is still in the ON state.

When the effect of the noise disappears after about 1–10 microseconds, the second reset switch 12 is turned OFF at time $t_2$. Thus, although the output $V_2$ of the second operational amplifier 10 varies by $\Delta V_1 \times (C_5/C_4)$ after time $t_2$, where $\Delta V_1$ is the change in the output voltage $V_1$, the effect of the switching noise does not appear in the output voltage $V_2$.

Although the photodiode 1 is employed as a photoelectric converter element, another photoelectric converter element can be used.

In addition, although the photoelectric converting circuit of FIG. 3 has a single photodiode 1 and produces a single output voltage, a plurality of photoelectric converting circuits of FIG. 3 can be used to arrange a photoelectric converting system that simultaneously converts a plurality of photoelectric currents into the output voltages.

The present invention has been described in detail with respect to a single embodiment, and it will now be apparent from the foregoing to those skilled in the art that changes and modifications may be made without departing from the invention in its broader aspects, and it is the intention, therefore, in the appended claims to cover all such changes and modifications that fall within the true spirit of the invention.

What is claimed is:

1. A photoelectric converting circuit comprising:
   a photoelectric converter element for generating a photoelectric current in accordance with a quantity of light;
   a first integrating circuit for integrating the photoelectric current to convert the photoelectric current into a first output voltage;
   a coupling capacitance having a first terminal and a second terminal, the first terminal of the coupling capacitance receiving the first output voltage; and
   a second integrating circuit having an input connected to the second terminal of the coupling capacitance, the second integrating circuit amplifying a second voltage applied to the input of the second integrating circuit from the first integrating circuit via the coupling capacitance.

2. The photoelectric converting circuit as claimed in claim 1, wherein each of said first integrating circuit and said second integrating circuit comprises:
   an operational amplifier having an inverting terminal and an output terminal;

an integration capacitance connected between the inverting input terminal and the output terminal of the operational amplifier; and a switch connected in parallel with the integration capacitance.

3. The photoelectric converting circuit as claimed in claim 2, wherein both the switch of the first integrating circuit and the switch of the second integrating circuit are initially switched to be conducting, the switch of the first integrating circuit thereafter being switched to be non-conducting and the second integrating circuit being switched to be non-conducting a predetermined time period after the first integrating circuit is switched to be non-conducting.

4. The photoelectric converting circuit as claimed in claim 1, wherein an amplification factor of the second integrating circuit in combination with the coupling capacitance is C5/C4, where C4 is a capacitive value of the integration capacitance of the second integrating circuit and C5 is a capacitive value of the coupling capacitance.

5. A photoelectric converting system comprising a plurality of photoelectric converting circuits, each respective photoelectric converting circuit comprising:

a photoelectric converter element for generating a photoelectric current in accordance with a quantity of light;

a first integrating circuit for integrating the photoelectric current to convert the photoelectric current into a first output voltage;

a coupling capacitance having a first terminal and a second terminal, the first terminal of the coupling capacitance receiving the first output voltage; and a second integrating circuit having an input connected to the second terminal of the coupling capacitance, said second integrating circuit amplifying a second voltage applied to the input of the second integrating circuit from the first integrating circuit via the coupling capacitance.

6. The photoelectric converting system as claimed in claim 5, wherein each of the first and second integrating circuits of each respective photoelectric converting circuit comprises:

an operational amplifier having an inverting terminal and an output terminal;

an integration capacitance connected between the inverting input terminal and the output terminal of the operational amplifier; and a switch connected in parallel with the integration capacitance.

7. The photoelectric converting system as claimed in claim 6, wherein an amplification factor of the second integrating circuit in combination with the coupling capacitance of each respective photoelectric converting circuit is C5/C4, where C4 is a capacitive value of the integration capacitance of the second integrating circuit and C5 is a capacitive value of the coupling capacitance, respectively, of each respective photoelectric converting circuit.

* * * * *